United States Patent
Phillips et al.

(10) Patent No.: US 10,154,614 B1
(45) Date of Patent: Dec. 11, 2018

(54) AIR HANDLING UNIT INTAKE AIR PREHEAT SYSTEM AND METHOD

(71) Applicant: Amazon Technologies, Inc., Reno, NV (US)

(72) Inventors: Matthew Thomas Phillips, Bainbridge Island, WA (US); Alan Donald Gillooly, Auburn, WA (US)

(73) Assignee: Amazon Technologies, Inc., Reno, NV (US)

( * ) Notice: Subject to any disclaimer, the term of this patent is extended or adjusted under 35 U.S.C. 154(b) by 1099 days.

(21) Appl. No.: 14/296,368

(22) Filed: Jun. 4, 2014

(51) Int. Cl.
H05K 5/00 (2006.01)
H05K 7/20 (2006.01)

(52) U.S. Cl.
CPC ..... *H05K 7/20745* (2013.01); *H05K 7/20836* (2013.01)

(58) Field of Classification Search
CPC ............ H05K 7/20836; H05K 7/20745; F24F 11/0009; F24F 2013/211
See application file for complete search history.

(56) References Cited

U.S. PATENT DOCUMENTS

| | | | |
|---|---|---|---|
| 4,267,967 A * | 5/1981 | Beck | G05D 23/1925 236/49.3 |
| 4,446,703 A | 5/1984 | Gilbertson | |
| 4,698,979 A | 10/1987 | McGuigan | |
| 5,324,229 A * | 6/1994 | Weisbecker | F24F 13/04 454/233 |
| 5,346,127 A * | 9/1994 | Creighton | G05D 23/138 165/248 |
| 5,533,348 A * | 7/1996 | Baldwin | F24F 11/0009 236/DIG. 19 |

(Continued)

FOREIGN PATENT DOCUMENTS

JP 2012193876 A * 10/2012 ............ F24F 3/14

OTHER PUBLICATIONS

Kimre, Mist Eliminators, https://web.archive.org/web/20130523150049/http://www.kimre.com/products/mist_eliminators.html, May 23, 2013.*
(Continued)

*Primary Examiner* — Kenneth Rinehart
*Assistant Examiner* — Phillip E Decker
(74) *Attorney, Agent, or Firm* — Robert C. Kowert; Meyertons, Hood, Kivlin, Kowert & Goetzel, P.C.

(57) ABSTRACT

A preheat damper preheats ambient air being directed to an air handling unit of a data center to mitigate ice accumulation caused by the ambient air. The ambient air can be preheated upstream of a mist eliminator, which removes moisture from the ambient air upstream of the air handling unit, to mitigate ice accumulation in the mist eliminator. The preheat damper directs exhaust air from an exhaust air plenum. The preheat damper can be adjusted based on the ambient temperature, and can be upstream of a return damper which directs exhaust air from the exhaust air plenum based on characteristics of the cooling air supplied to cool data center equipment. The return damper can be adjusted in counter-opposition with one or more intake dampers to maintain cooling air characteristics, and concurrently with the preheat damper to direct ambient air to the air handling unit through the exhaust air plenum.

20 Claims, 7 Drawing Sheets

(56) References Cited

U.S. PATENT DOCUMENTS

| | | | |
|---|---|---|---|
| 6,141,986 | A | 11/2000 | Koplin |
| 6,223,545 | B1 | 5/2001 | Kinkel et al. |
| 6,681,584 | B1 | 1/2004 | Conner |
| 7,010,392 | B2 | 3/2006 | Bash et al. |
| 7,197,433 | B2 | 3/2007 | Patel et al. |
| 7,278,273 | B1 | 10/2007 | Whitted et al. |
| 8,141,374 | B2 * | 3/2012 | Hay ................... H05K 7/20745 62/171 |
| 8,151,578 | B1 * | 4/2012 | Morales ................ F24F 3/0442 62/259.2 |
| 8,721,409 | B1 * | 5/2014 | Morales ............. H05K 7/20209 454/184 |
| 9,278,303 | B1 * | 3/2016 | Somani ................. B01D 47/06 |
| 9,313,929 | B1 * | 4/2016 | Malone ............. H05K 7/20836 |
| 9,372,516 | B2 * | 6/2016 | Ross ....................... G06F 1/206 |
| 9,420,725 | B2 * | 8/2016 | Honda ................. F24F 1/0007 |
| 9,426,903 | B1 * | 8/2016 | Morales ................... H05K 5/00 |
| 9,949,410 | B1 * | 4/2018 | Kowalski ............ H05K 999/99 |
| 2003/0158718 | A1 | 8/2003 | Nakagawa et al. |
| 2005/0228618 | A1 | 10/2005 | Patel et al. |
| 2007/0101746 | A1 | 5/2007 | Schlom et al. |
| 2008/0029250 | A1 | 2/2008 | Carlson et al. |
| 2008/0055846 | A1 | 3/2008 | Clidaras et al. |
| 2008/0094797 | A1 | 4/2008 | Coglitore et al. |
| 2008/0148746 | A1 | 6/2008 | Yanik et al. |
| 2008/0259566 | A1 | 10/2008 | Fried |
| 2008/0288193 | A1 | 11/2008 | Claassen et al. |
| 2009/0301123 | A1 * | 12/2009 | Monk .................. F24F 11/0001 62/259.2 |
| 2011/0195652 | A1 * | 8/2011 | Smith ................ H05K 7/20836 454/184 |
| 2011/0256822 | A1 * | 10/2011 | Carlson .............. H05K 7/20827 454/184 |
| 2011/0300789 | A1 * | 12/2011 | Kinoshita ............ F24F 11/0001 454/184 |
| 2011/0306288 | A1 * | 12/2011 | Murayama ........... F24F 11/0001 454/184 |
| 2012/0164930 | A1 * | 6/2012 | Murayama ......... H05K 7/20745 454/184 |
| 2012/0171943 | A1 * | 7/2012 | Dunnavant ........ H05K 7/20745 454/184 |
| 2012/0234527 | A1 * | 9/2012 | Murayama ............. G05D 22/02 165/287 |
| 2012/0298334 | A1 * | 11/2012 | Madaffari .......... H05K 7/20745 165/104.13 |
| 2013/0098597 | A1 * | 4/2013 | Fujimoto ............ H05K 7/20745 165/287 |
| 2013/0133350 | A1 * | 5/2013 | Reytblat ............ H05K 7/20718 62/259.2 |
| 2013/0299157 | A1 * | 11/2013 | Murayama ......... H05K 7/20745 165/224 |

OTHER PUBLICATIONS

U.S. Appl. No. 11/535,180, filed Sep. 26, 2006, Osvaldo Patricio Morales.

U.S. Appl. No. 12/163,146, filed Jun. 27, 2008, Osvaldo Patricio Morales.

U.S. Appl. No. 11/956,849, filed Dec. 14, 2007, Osvaldo Patricio Morales.

* cited by examiner

AIR HANDLING UNIT INTAKE AIR PREHEAT SYSTEM AND METHOD

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many computing racks, which may include server racks. Each computing rack, in turn, may include many computer systems, servers, associated computer equipment, etc.

Electronic components generate waste heat energy when in use. This heat energy should be removed to mitigate a potential for component overheating and subsequent malfunction. Computer systems typically include a number of such components, or waste heat sources, that include, but are not limited to, printed circuit boards, mass storage devices, power supplies, and processors. For example, one personal computer system may generate 100 watts to 150 watts of waste heat and some larger computers with multiple processors may generate 250 watts of waste heat. Some known computer systems include a plurality of such larger, multiple-processor computers that are configured into rack-mounted components, and then are subsequently positioned within a rack computing system. Some known rack computing systems include 40 such rack-mounted components and such rack computing systems will therefore generate as much as 10 kilowatts of waste heat. Moreover, some known data centers include a plurality of such rack computing systems.

Some known data centers include methods and apparatuses configured to facilitate waste heat removal from a plurality of racking systems. Some data centers rely on forced air systems and air conditioning to maintain the temperatures and other environmental conditions in the data center within acceptable limits. The initial and ongoing costs of installing and operating these systems may add substantial cost and complexity to data center operations.

Some data centers use outside air, also referred to hereinafter and interchangeably as "ambient air", as an important source of cooling air used for waste heat removal. The outside air can be directed to remove heat from equipment in the data center. The outside air can be cooled via one or more various air cooling systems. The characteristics and quality of outside air may vary widely, however, even at a given location.

In some cases, outside air includes water vapor. This vapor, also referred to as "moisture", can condense on various surfaces and equipment in a data center as outside air is directed into and through portions of the data center. Such condensation can damage various equipment in the data center. In addition, in some cases the moisture can condense out of the air and freeze, deposit out of the air, etc. to form ice on various surfaces and equipment. In addition to damaging various equipment, ice accumulation caused by such condensation or deposition can restrict the cross-sectional flow area of various portions of the data center, which can restrict the supply of cooling air to equipment in the data center. Such restriction can starve data center equipment of cooling air, which can lead to heat buildup and thermal damage to the equipment therein.

Figure 1:
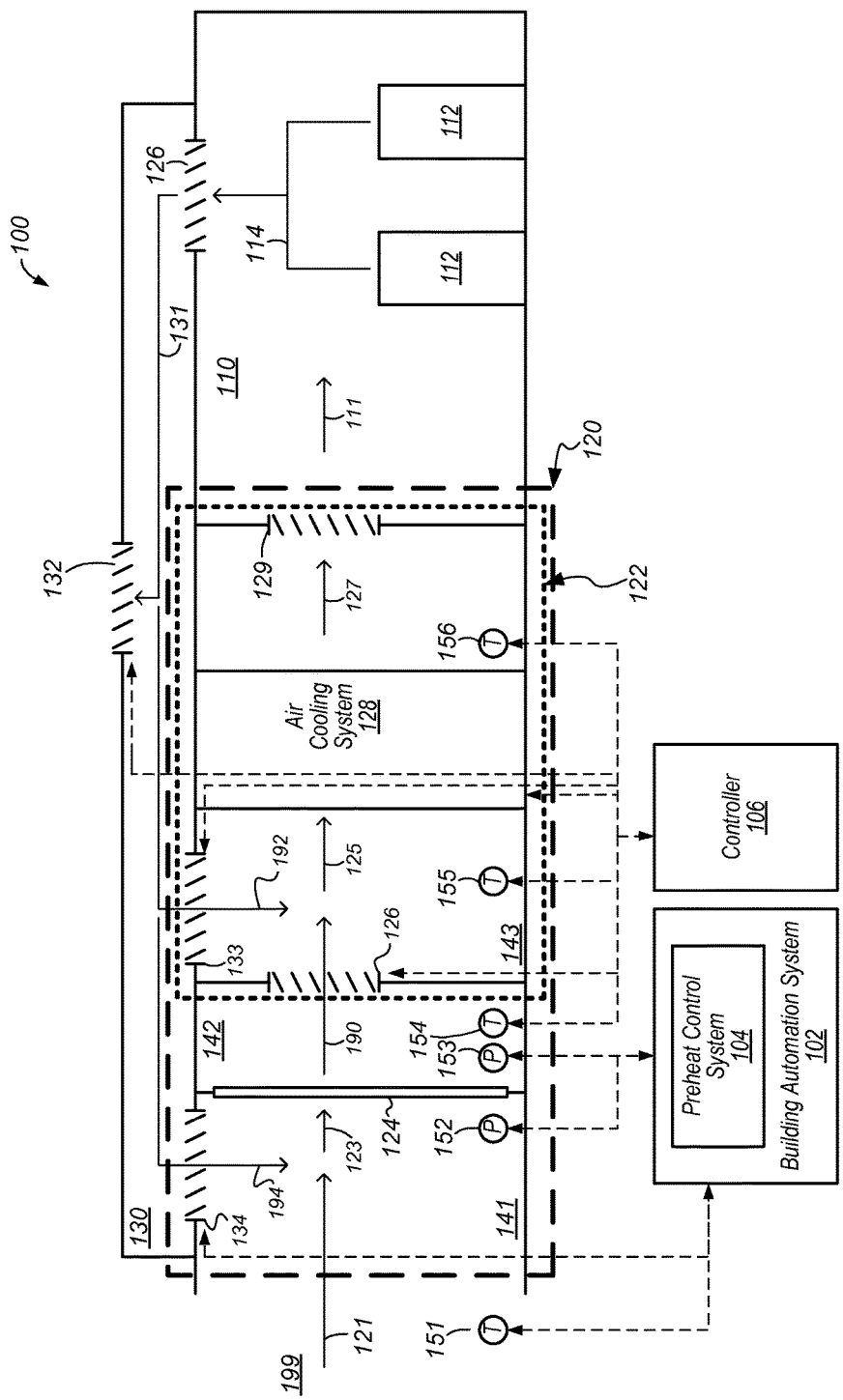
FIG. 1 is a cross-sectional schematic view of a data center that includes an air preheat damper system, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of an air supply system which includes a preheat air damper are disclosed. According to one embodiment, a system for cooling computer systems in a room of a data center includes an exhaust air plenum, an air handling unit, an intake air plenum, a mist eliminator, a preheat air damper, and a controller. The air handling unit supplies cooling air to computer systems in a room of a data center, and includes an air cooling unit that removes heat from the cooling air, a filter upstream from the air cooling unit, an intake air damper that controls a supply of intake air to the air cooling unit, and a return air damper that controls a supply of exhaust air from the exhaust air plenum to mix with the intake air upstream of the air cooling unit. The intake air plenum directs ambient air into the air handling unit as the intake air. The mist eliminator is upstream from the intake air plenum and includes a mesh structure that removes moisture from ambient air directed into the intake air plenum. The preheat air damper directs exhaust air from the exhaust air plenum to mix with the ambient air upstream of the mist eliminator. The controller is coupled to the preheat air damper and adjustably positions the preheat air damper to control the flow of exhaust air based on the ambient air temperature, so that ice accumulation in the mesh structure of the mist eliminator is at least partially mitigated.

According to one embodiment, a method includes providing an air handling unit that supplies cooling air to a computer room of a data center and directing intake air to the air handling unit to provide the cooling air. Directing the intake includes directing ambient air from an ambient environment to the air handling unit, via a mist eliminator upstream of the air handling unit, to provide the intake air. Directing the intake air further includes adjustably positioning a return air damper to direct exhaust air received from the computer room to mix with the intake air upstream of the air handling unit, at a location downstream of the mist eliminator, if a first set of control conditions is determined to be met. Directing the intake air can further include adjustably positioning a preheat damper to direct exhaust air received from the computer room to mix with the ambient air, at a location upstream of the mist eliminator, if a second set of control conditions is determined to be met.

According to one embodiment, a method includes directing ambient air from an ambient environment through an air handling unit to provide cooling air into a room. Such directing includes adjustably preheating ambient air directed to the air handling unit, upstream of mixing the ambient air with heated air based at least in part upon characteristics of the cooling air downstream of the air handling unit, based at least in part upon at least one measured characteristic of ambient air in the ambient environment.

As used herein, "air handling system" means a system that provides or moves air to, or removes air from, one or more systems or components.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, "ambient" refers to a condition of outside air at the location of a system, structure, data center, etc. An ambient temperature may be taken, for example, at or near an intake hood of an air handling system.

As used herein, a "chimney effect" or "stack effect" refers to a flow of air through a pathway that is induced by an air density difference between the ends of the pathway. Such a difference may be induced by one or more various factors, including temperature differences between the ends of the pathway, ambient pressure differences, humidity differences, and the like. For example, where a building with a warm enclosure is surrounded by a colder ambient environment, the chimney effect may refer to an induced flow of air through a pathway (e.g., a chimney) between the enclosure and the environment that is induced by an air-density difference between the lower-density warmer air of the enclosure passing through the pathway to the environment while being displaced by the higher-density colder air from the environment.

As used herein, "mechanical cooling" means cooling of air by a process that involves doing mechanical work on at least one fluid, such as occurs in vapor-compression refrigeration systems. Mechanical cooling may include sensible cooling.

As used hereinafter, the terms "cool" and "chill", and variations thereof, are used interchangeably.

As used herein, "sensible cooling" refers to cooling of air where sensible heat of the air is removed to as to reduce the dry bulb temperature of the air without appreciable change in the moisture content of the air. For example, during a sensible cooling process the dry bulb temperature and wet bulb temperature of the air may be reduced, while the latent heat and dew point temperature of the air may not appreciably change.

As used herein, "evaporative cooling" refers to cooling of air by evaporation of liquid. Evaporative cooling may include adiabatic cooling of the air, whereby the dry bulb temperature of the air is reduced without appreciable change in the enthalpy of the air. Adiabatic cooling may include reducing the dry bulb temperature of the air without appreciable change of the wet bulb temperature of the air.

As used herein, "direct evaporative cooling" means cooling of air by evaporation of liquid directly into a stream of air to be cooled.

As used herein, "evaporative cooling system" means a system that cools by evaporation of a liquid.

As used herein, a "chiller-less air cooling system" refers to an air cooling system that provides cooling air independent of internal mechanical cooling systems. Some chiller-less air cooling systems include an evaporative cooling system. Some chiller-less air cooling systems, in some embodiments, operate in a free-cooling mode without internal evaporative cooling systems or mechanical cooling systems.

As used herein, a "free cooling mode" includes a mode of operation in which an air handling system pulls air at least partially from an external source (such as air outside a facility) and forces the air to electronic equipment without active chilling in the air-handling system (e.g., fluid flow through the chiller coils in the air handling sub-system is shut off by closing a flow control valve).

As used herein, "room" means a room or a space of a building. A "computer room" means a room in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, a "flow control element" includes any device or component that can be moved to control (e.g., increase or decrease) the flow of fluid through a duct or other passageway. In some embodiments, a flow control element includes one or more damper. Examples of dampers include plates, blades, panels, or discs, or any combination thereof. A damper may include multiple elements. For example, a damper may include a series of plates in parallel relation to one another that can be simultaneously rotated to close a duct. As used herein, to "position" a damper means to place or leave one or more elements of the damper to achieve desired flow characteristics through the damper, such as open, closed, or partially open. In a system with eighteen air handling sub-systems, positioning the outside air dampers may include opening outside air dampers in eight of the sub-systems and keeping outside air dampers closed in the other ten sub-systems.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, a "rack computer system" means a computer system that includes one or more computing devices mounted in a rack.

FIG. 1 is a cross-sectional schematic view of a data center that includes an air preheat damper system, according to some embodiments. Data center 100 includes a computer room 110 in which electrical loads 112 are installed, an air supply system 120, an exhaust air plenum 130, and controller systems 102, 106.

In some embodiments, electrical loads in a computer room, including loads 112, include one or more rack computer systems which include computer systems installed in one or more racks, where the rack computer systems include one or more heat-producing components. Such components, which can include one or more mass storage devices (including hard disk drives), processor circuitry (including central processing units), can generate heat. Air can flow through a rack computer system to remove heat from the heat producing components included therein. Such air can be introduced into the computer room 110 as cooling air 111. Air which has removed heat from one or more heat producing components in one or more loads 112 is referred to herein as exhaust air 114. One or more exhaust air flows 114 can pass from one or more exhaust ends of the loads 112 and out of computer room 110 via one or more exhaust vents 126. In some embodiments, the exhaust air flow 114 passes from load 112 to vent 126 via one or more gradients towards the vent 126, including a pressure gradient, air density gradient, a chimney effect, some combination thereof, or the like.

As shown in FIG. 1, some embodiments of a data center 100 include an exhaust air plenum 130 into which exhaust air 114 passes via vent 126. Exhaust air 131 entering the plenum 130 from the vent 126 can circulate through some or all of the plenum 130. The exhaust air can exit the plenum 130, and the data center 110, via an exit vent 132 to the ambient environment 199.

In some embodiments, cooling air is supplied to electrical loads from an air supply system. The air supply system can include one or more air handling units, which can supply cooling air to the loads, condition the air to have certain properties, etc. Such conditioning can include cooling the air to a certain temperature, inducing a flow rate of cooling air to the electrical loads, etc. In the illustrated embodiment, for example, cooling air 111 is supplied into computer room 110 from an air supply system 120. Air supply system 120 can receive ambient air 121 from an ambient environment 199 and supply at least some of the air to computer room 110 as at least a portion of cooling air 111.

Air supply system 120 can include an air handling unit 122 which handles air received from various sources to supply the cooling air 111 to electrical loads 112 in room 110 via supply air damper 129. Such handling can include cooling one or more air flows to provide the cooling air. For example, the illustrated embodiment of air handling system 122 includes an air cooling system 128 which cools air 125 to provide cooling air 127, which is then supplied to computer room 110 via supply air damper 129 as cooling air 111. Air cooling system 128 can include one or more various cooling systems that will be familiar to those having ordinary skill in the art, including one or more mechanical cooling systems, evaporative cooling systems, some combination thereof, or the like.

In some embodiments, air handling system 122 mixes two or more separate air flows to provide the cooling air 127 to computer room 110. The two or more separate air flows can include an intake air flow 190 which at least partially includes ambient air 121 from an ambient environment. Air handling unit 122 can include a mixing plenum 143, upstream of the air cooling system 128, where intake air flow 190 enters the mixing plenum 143 from an intake air plenum 142 via one or more sets of intake air dampers 126 and return air flow 192 enters the mixing plenum 143 from exhaust air plenum 130 via one or more sets of return air dampers 133. The return air flow 192 and intake air flow 190 can mix in plenum 143 to provide air flow 125, which can be referred to as a mixed air flow and can be supplied to computer room 110 as air flow 127. In some embodiments, the mixed air flow 125 is directed from plenum 143 through air cooling system 128 to provide air flow 127 as a cooled air flow 125.

In some embodiments, one or more of the dampers, including dampers 126, 133, etc. can be adjustably positioned to adjustably position one or more characteristics of cooling air 127 supplied into computer room 110. For example, the relative proportions of intake air and return air can be adjustably positioned, by adjustably positioning dampers 126, 133.

In some embodiments, one or more elements of data center 100 are adjustably positioned to adjustably position cooling air 127 supplied to computer room 110 as cooling air 111. Such control can be implemented by one or more controllers, which themselves can be implemented, at least partially, by one or more computer systems as discussed further below. In the illustrated embodiment, data center 100 includes controller 106 which is communicatively coupled to dampers 126, 133, 132, and air cooling system. Controller 106 is further communicatively coupled to sensors 154, 155, 156. Sensors 154, 155, 156 are temperature sensors in the intake air plenum, mixing air plenum, and downstream of the air cooling system, respectively. In some embodiments, controller 106 adjustably positions one or more of dampers 126, 133, 132 and air cooling system 128 to maintain one or more characteristics of cooling air 127. For example, controller 106 may adjustably position the positioning of one or more dampers to maintain the temperature of cooling air 127 within one or more temperature ranges, between one or more high and low temperature thresholds, etc. Controller 106 may control air cooling by air cooling system; for example, controller 106 may adjustably position a chilled water supply valve for a chilled water mechanical cooling system in system 128 to control cooling of mixed air 125 to provide cooling air 127. Such control may be based at least in part upon temperature sensor data received from one or more of sensors 154, 155, 156.

In some embodiments, air handling unit 122 includes one or more banks of air filters. Such filters can remove various debris, particulate matter, substances, etc. from air passing through the air supply system. In some embodiments, the one or more banks of air filters are upstream of the air cooling system 128 and downstream of mixing air plenum 143.

Ambient air 121 received into a data center 100 can include various amounts of moisture which can condense on to various surfaces, equipment, etc. in the data center. Such moisture in air can be indicated by one or more of the relative humidity, wet bulb temperature, etc. of the air. In the illustrated embodiment, ambient air 121 is received into an ambient air plenum 141 of the data center, from plenum 141 into an intake air plenum 142, from plenum 142 to mixing plenum 143 of air handling unit 122 via one or more sets of intake air dampers 126, etc. Based at least in part upon one or more of the temperature and moisture content in the ambient air 121, moisture can condense out of the air on to various surfaces and equipment in the data center 100, particularly based at least in part upon changes in temperature, pressure, etc. of the air as it passes through the data center. Such condensed moisture can damage certain equipment, for example by shorting electrical equipment, corroding surfaces, etc.

In some embodiments, a mist eliminator device is installed in an air supply system of the data center. The mist eliminator device can be installed at an upstream location in the air supply system, including a location upstream of an air handling unit, and the mist eliminator device can include a mesh structure which removes moisture from an ambient air flow received into the data center. For example, in the illustrated embodiment, air supply system 120 includes a mist eliminator device 124 (also referred to hereinafter as a "mist eliminator") which is installed upstream of intake air plenum 142, air handling unit 122, etc. Ambient air 121 which passes into ambient air plenum 141 upstream of the mist eliminator passes through the mist eliminator 124 to the intake air plenum 142 as intake air 190, from whence the air can pass into the air handling unit 122 via one or more sets of intake air dampers 126. Mist eliminator 124 can remove at least some of the moisture included in the ambient air 121. In some embodiments, mist eliminator 124 is upstream of one or more banks of air filters, including filters configured to remove solid particulate matter from air flow, which may themselves be included in one or more portions of the air handling unit 122.

Where the temperature of the ambient air 121 is below a certain temperature, moisture condensed out of an air flow can freeze, which can accumulate over time to restrict air passages in the data center, in addition to potentially damaging equipment. Where the moisture is removed from an air flow by a mist eliminator, the moisture removed in the mist eliminator can freeze, which can result in ice accumulation in the mist eliminator. The accumulated ice can partially or fully restrict air flow through the mist eliminator, which can restrict intake air flow 190 into the air handling unit 122. Furthermore, the restricted air flow can induce a pressure differential across the mist eliminator 124 which can potentially cause the air handling unit 122 to incur damage through implosion if the pressure differential exceeds a threshold amount of pressure.

In some embodiments, a preheat air damper 134 at least partially mitigates ice accumulation in the mist eliminator device 124 through directing a portion of recirculated exhaust air 131 from the exhaust air plenum 130 of a data center 100 to the ambient air plenum 141 as preheat air flow 194 to mix with the ambient air 121, upstream of the mist eliminator 124. The exhaust air 194 directed to mix with the ambient air 121 can result in an air flow 123 which has an increased temperature relative to the ambient air flow 121, as the exhaust air 131. Such an air flow 123 may be referred to as a "preheated air flow", "tempered air flow", etc. In some embodiments, the increased temperature of air flow 123 results in ice formation and accumulation in the mist eliminator 124 being at least partially mitigated. For example, where the ambient air 121 is approximately at a freezing temperature of the water in the ambient air, mixing the ambient air 121 with exhaust air 194 may result in an air flow 123 with a temperature approximately 20 degrees Fahrenheit above that of the ambient air 121, where the air flow 123 has a temperature that is sufficiently high to preclude ice accumulation in the portion of the mist eliminator 124 through which the air flow 123 passes.

As shown, preheat air damper 134 can direct exhaust air 131 out of the exhaust air plenum 130 as preheat air flow 194, while return air damper 133 also directs exhaust air 131 out of the exhaust air plenum. But while return air damper 133 can be adjustably positioned to mix exhaust air from the exhaust air plenum with intake air 125 to result in a mixed air flow, and where return air damper 133 can be adjustably positioned by controller 106 based at least in part upon characteristics of the cooling air 127, preheat air damper 134 can adjustably position exhaust air flow from the exhaust air plenum based at least in part upon characteristics of the ambient air 121. As shown, data center 100 includes a building automation system (BAS) 102, which includes a preheat air damper control system 104 which adjustably positions preheat air damper 134 to adjustably position the mixing of exhaust air with the ambient air 121 upstream of the mist eliminator 124 in the ambient air plenum 141. Control system 104 is communicatively coupled with temperature sensor 151 which measures the ambient air 121 temperature, and control system 104 can adjustably position the damper 134 based at least in part upon the temperature measurement by sensor 151. In some embodiments, one or more of system 102, system 104, etc. can be included in a common controller system with controller 106, which may be implemented by one or more various computer systems.

In some embodiments, the dampers 134, 133 which direct at least portions of exhaust air 131 from the exhaust air plenum 130 as respective air flows 194, 192 can be adjustably positioned together to direct ambient air 121 into the air handling unit 122 via a portion of the exhaust air plenum 130, thereby bypassing at least the intake air plenum 142, mist eliminator 124, and intake air dampers 126. Such control may be based at least in part upon pressure measurements in the data center 100, where the dampers 134, 133 may be both adjustably positioned to direct ambient 121 air from plenum 141 to plenum 143 of the air handling unit 122 via a portion of exhaust air plenum 130 between dampers 134, 133, based at least in part upon a determination that the pressure differential across the mist eliminator 124 between plenums 141, 142 exceed a threshold pressure amount. For example, as shown, control system 104 is communicatively coupled with pressure sensors 152, 153 which measure the air pressure in the ambient air plenum 141 and intake air plenum 142, respectively. Where the pressure difference between the measurements by sensors 152, 153 exceed a certain threshold amount, which can be associated with the implosion pressure difference of the air handling unit 122, mist eliminator 124, etc., one or more of control system 104 and controller 106 may adjustably position dampers 134, 133 to direct ambient air from plenum 141 to plenum 143 via a portion of exhaust air plenum 130 between the dampers 134, 133. Adjustably positioning both dampers 134, 133 can include adjusting both dampers to a fully-open configuration.

In some embodiments, one or more of the dampers illustrated in FIG. 1 can be a flow control element. For example, in some embodiments, preheat flow control element 134 can direct air 194 into plenum 141, return flow control element 133 can direct air 192 into plenum 143, one or more intake flow control elements 126 can direct air 190 into plenum 143, etc.

Figure 2:
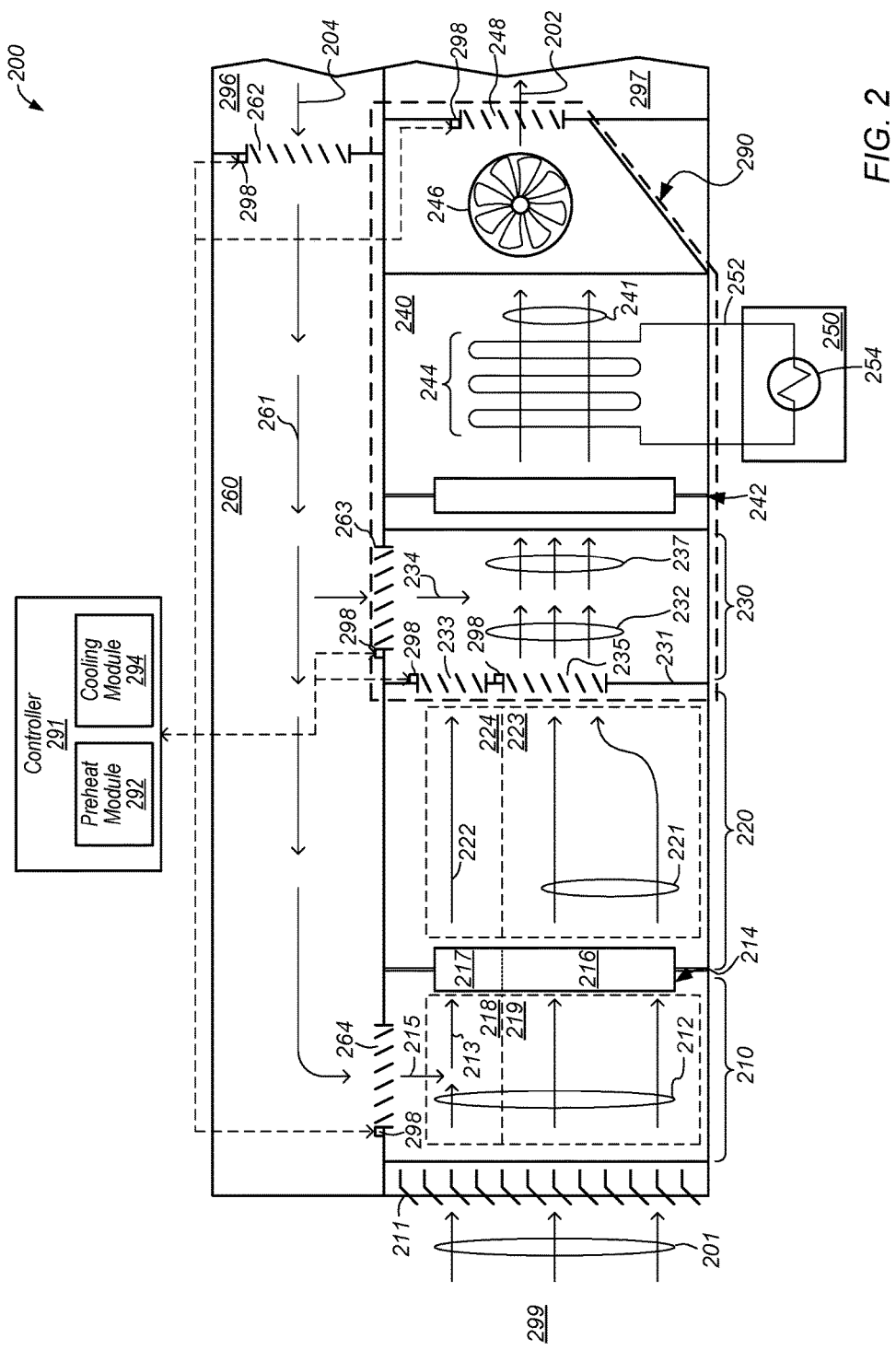
FIG. 2 is a cross-sectional schematic view of a portion of a data center that includes an air handling unit, exhaust air plenum, mist eliminator, and air preheat damper, according to some embodiments.

FIG. 2 is a cross-sectional schematic view of a portion of a data center that includes an air handling unit, exhaust air plenum, mist eliminator, and air preheat damper, according to some embodiments.

Data center 200 includes various air plenums handling systems, etc. which supply cooling air 202 which can cool various electrical loads in the computer room 297 of data center 200. To provide the cooling air 202 to computer room 297, ambient air 201 can be received into the data center 200 and provided to an air handling unit 290 as intake air 221-222. In some embodiments, exhaust air 204 discharged by electrical loads can be recirculated to mix with the intake air 221-222 to provide mixed air 237. In the illustrated embodiment, exhaust air 204 is directed from an exhaust air plenum 296, which receives exhaust air from electrical loads, into a return air plenum 260, where at least a portion of the exhaust air 204 directed into the return air plenum 260 is recirculated to mix with ambient air flows into data center 200, intake air flows 232 in air handling system 290, etc. The mixed air 237 can pass through at least a portion of the air handling unit 290 to be provided into computer room 297 as cooling air 202.

Data center 200 includes a set of louvers 211 which span across an opening in data center 200 through which an ambient air flow 201 can pass from the ambient environment 299 into data center 200. In particular, the ambient air flow 201 can pass through the set of louvers 211 and into an ambient air plenum 210. In some embodiments, the louvers 211 include surfaces angled to redirect environmental elements, including precipitation, sand, snow, etc., away from data center 200 such that the environmental elements are precluded from entering the ambient air plenum 210. In some embodiments, the louvers are fixed into a particular configuration, including an angled configuration angled downwards into the ambient environment 299.

Ambient air flow 201 enters and passes through ambient air plenum 210 as ambient air flow 212. The ambient air flow 212 passes through mist eliminator device 214 into intake air plenum 220 as intake air 221-222. Mist eliminator device 214 removes moisture from air passing through the mist eliminator device 214 from ambient air plenum 210 to intake air plenum 220. In some embodiments, mist eliminator device 214 includes a mesh structure through which air flows, where moisture in the air condenses onto portions of the mesh structure through which the air flows. Such condensation may be based at least in part upon impingement of the air flow on the mesh material. In some embodiments, the mist eliminator device includes a plate structure onto which the air flow from plenum 210 impinges to remove moisture from the air flow.

Intake air 221-222 passes through intake air plenum 220 to enter air handling unit 290. Air handling unit includes a mixing air plenum 230 and an air cooling system 240 downstream of the mixing plenum, where cooling air 202 is provided through a supply air damper 248 on a downstream end of the air handling unit 290 to cool various electrical loads in computer room 297 of data center 200. The upstream end of the air handling unit 290 includes an upstream wall element 231 and a set of intake air dampers 233, 235.

As shown in the illustrated embodiments, the set of intake air dampers can include multiple intake air dampers 233, 235. Intake air damper 233 can be a minimum intake air damper, and air damper 235 can be a primary intake air damper. As discussed further below, the intake air dampers 233, 235 can be adjustably positioned separately or in concert with each other to adjustably position a flow rate of intake air 221-222 into the mixing air plenum 230 as intake air 232.

In some embodiments, intake air received into an air handling unit is mixed with recirculated exhaust air to provide cooling air. The exhaust air can be mixed with the intake air to provide mixed air. As shown, data center 200 includes a return air damper 263 which is adjustably positionable to adjustably position a return air flow 234 of recirculated exhaust air from return air plenum 260 into mixing air plenum 230, where the return air flow 234 can mix with intake air flow 232 to provide a mixed air flow 237.

As shown, return air plenum 260 receives an exhaust air flow 204 via exhaust air damper 262. The exhaust air 261 circulating through plenum 260 can be at least partially directed into mixing air plenum 230 via return air damper as return air flow 234.

The mixed air flow 237 passes from mixing plenum 230 into air cooling system 240, which includes a filter bank 242 and cooler 244. In some embodiments, a cooler can include one or more of a mechanical cooler, evaporative cooler, etc. In the illustrated embodiment, cooler 244 is a mechanical cooler which circulates a coolant through a set of coolant lines 252 and removes heat from the air flow 241 from mixing plenum 230, via filter bank 242, into the coolant circulating through the coolant lines 252. As shown, the coolant lines 252 comprise a coolant loop between cooler 244 and a coolant plant 250 which removes heat from the coolant and recirculates the coolant to cooler 244 to remove additional heat from air flow 241. Coolant plant 250 includes a heat exchanger, which can include one or more heat exchanger apparatuses of various types known in the art, which removes heat from coolant circulating through coolant lines 252 downstream of the cooler 244.

In some embodiments, the various air flows illustrated are induced based at least in part upon one or more various gradients through the data center, including one or more pressure gradients, air density gradients, etc. In some embodiments, the gradients are induced by one or more air moving devices. As shown in the illustrated embodiment, for example, air cooling system 240 includes one or more air moving devices 246 which operate to induce an air pressure gradient. Air moving devices 246 can include one or more fans, blowers, compressors, etc. An air moving device 246 can reduce the air pressure at an inlet side of the air moving device 246 relative to at least the ambient environment 299, thereby establishing a pressure gradient from the ambient environment 299 towards air moving device 246 through the plenums 210, 220 and air handling unit 290, thereby inducing air flow from the ambient environment 299 towards the air moving device 246.

Data center 200 includes a preheat air damper 264 which is adjustably positionable to direct an adjustably positionable preheat air flow 215 of exhaust air from return air plenum 260 into ambient air plenum upstream of the mist eliminator device 214. The preheat air flow 215 can mix with at least a portion of the ambient air flow 212 through the ambient air plenum 210 to provide a mixed air flow 213 which passes through the mist eliminator 214 to intake air plenum 220 as intake air flow 222, while the portion of the ambient air flow 212 which is not mixed with the preheat air flow 215 passes through mist eliminator device 214 into the intake air plenum 220 as intake air flow 221.

As noted and described above, mixing a preheat air flow 215 with an ambient air flow 212 can provide a mixed air flow 213 with an elevated temperature relative to the ambient air flow 212. The preheat air damper 264 can be adjustably positioned to direct the preheat air flow 215 into the ambient air plenum 210 based at least in part upon a determination that an ambient temperature of the ambient air flow 201 is less than a predetermined threshold.

The preheat air flow 215 can preheat at least a portion of ambient air flow 212 to raise the temperature of the portion of the flow, so that ice accumulation in the mist eliminator device 214 is precluded in the portions through which the mixed air flow 213 passes. For example, as shown in the illustrated embodiment, ambient air plenum 210 includes an upper portion 218 and a lower portion 219, and preheat air damper 264 may be positioned at an upper end of the plenum 210, proximate to the upper portion 218, so that the preheat air flow 215 mixes with ambient air flow 212 through the upper portion 218 and not ambient air 212 passing through the lower portion 219. As a result, the mixed air flow 213 from the upper portion 213 can have an elevated temperature, relative to that of the ambient air flows 201, 212, which can preclude ice accumulation in the upper portion 217 of the mist eliminator 214 through which the mixed air flow passes. For example, while moisture may be removed from mixed air flow 213 in the upper portion 217 of the mist eliminator 214, the elevated temperature of air passing through the upper portion 217 can preclude the condensed moisture from freezing in the upper portion 217.

While the mixed air flow 213 in the upper portion 213 of plenum 210 passes through the upper portion 217 of mist eliminator 214 and into intake air plenum 220 as intake air flow 222, the ambient air flow 212 passing through the lower portion 219 of plenum 210 passes through the lower portion 216 of the mist eliminator 214 and into intake air plenum 220 as intake air flow 221. Because the air flow 212 may not mix with preheat air flow 215, moisture condensing out of the air flow 212 through the lower portion 216 of the mist eliminator 214 may freeze where the ambient air flow 212 temperature is below a certain temperature. As a result, ice may accumulate in the lower portion 216 of mist eliminator 214, which can restrict air flow through the lower portion 216. In contrast, the condensed moisture from mixed air flow 213 in upper portion 217 may remain in a liquid state in the upper portion 217, fall into the lower portion 219 and freeze therein, etc. Thus, where the temperature of ambient air flow 201, 212 is below a certain temperature, the lower portion 216 of mist eliminator 214 may be at least partially obstructed by ice accumulation, restricting ambient airflow through the mist eliminator 214, while a preheat air flow 215 into the plenum 210 via preheat air damper 264 heats at least some of the ambient air flow in an upper portion 218 of the plenum 218 to provide a mixed air flow 213 which passes through an upper portion 217 of the mist eliminator 214, thereby at least partially mitigating ice accumulation in the upper portion 217 of the mist eliminator and at least partially mitigating obstruction of the mist eliminator 214. Where the lower portion 216 becomes at least partially obstructed, based at least in part upon ice accumulation therein, the flow rate, flow velocity, etc. through the upper portion 217 may be increased relative to where both portions 217, 216 are not obstructed. Such increased flow can further at least partially mitigate ice formation in the upper portion 217 by directing ambient air 212 to pass through upper portion 218 of plenum 218, where the air flow can be mixed with preheat air flow 215 to raise the ambient air flow temperature.

In some embodiments, the preheat air damper is located proximate to a lower portion 219 of the ambient air plenum 210, so that the preheat air flow 215 through the plenum 210 rises through the lower portion 219 and into the upper portion 218 based at least in part upon one or more of a temperature gradient, air density gradient, etc. towards the upper portion 218.

In some embodiments, preheat air damper 264 is a two-position damper which can be adjustably positioned into either a fully-closed configuration, where preheat air flow 215 is completely restricted, and a fully-open configuration where the preheat air flow 215 is maximized. A fully-closed configuration may be referred to as a "closed configuration", "closed position", etc. A fully-open configuration may be referred to as an "open configuration", "open position", etc. In some embodiments, preheat air damper 264 is adjustably positionable to be adjusted between one or more of a plurality of configurations, positions, etc. between fully-open and fully-closed. Adjustment of a damper between various configurations, positions, etc. is referred to hereinafter as "modulating" the damper. The preheat air damper 264 can be adjustably positioned based at least in part upon a temperature of the ambient air flow 201, 212, ambient environment 299, some combination thereof, or the like.

In some embodiments, the various dampers in data center 200 are adjustably controlled by one or more portions of a controller, which can be implemented at least partially by one or more computer systems. Adjustable control of a damper, adjustably controlling a damper, etc. can include adjustably positioning the damper. In the illustrated embodiment, controller 291 is communicatively coupled to each of the illustrated dampers 264, 263, 233, 235, 262, 248 via separate communication pathways. As also shown, each of the dampers includes an actuator 298 which is mechanically coupled to the respective damper and is configured to adjust the respective damper based at least in part upon command signals received from the controller 291 via a communication pathway between the actuator 298 and the controller 291. In some embodiments, controller 291 which adjustably positions the dampers in data center 200 includes multiple modules which each control a limited selection of the dampers. For example, module 292 is a preheat module which generates command signals to transmit to the actuator 298 of preheat air damper 264. In addition, module 294 is a cooling module, which generates command signals to transmit to the respective actuators 298 of the dampers 233, 235, 263 to adjustably position air flow through the various dampers. In some embodiments, one or more of the modules 292 and 294 is configured to adjustably position at least preheat air damper 264 and return air damper 264 to direct ambient air flow 212 into mixing air plenum 230 via a portion of return air plenum 260. In some embodiments, one or more portions of controller 291 adjustably positions one or more of the dampers in data center 200 based at least in part upon sensor measurement data received from various sensors in data center, including the sensors illustrated in FIG. 1. For example, module 292 can adjustably position the preheat air damper 264, to a fully-closed configuration, such that preheat air flow 215 is restricted, based at least in part upon a determination that the ambient temperature of ambient environment 299 is above a certain temperature. Where the ambient environment 299 temperature is determined to be below a certain threshold temperature, which can be a certain margin above a freezing temperature of water (e.g., 39 degrees Fahrenheit), module 292 can adjustably position the preheat air damper 264 into a fully-open configuration, so that a maximum preheat air flow 215, which corresponds to a maximum air flow which can be directed through damper 264, is directed into upper portion 218 of the ambient air plenum 210 to mix with a portion of ambient air flow 212.

In some embodiments, the set of intake air dampers 233, 235 includes a minimum intake air damper 233 and a primary intake air damper 235. Minimum intake air damper 233 may be sized to direct an intake air flow, when the damper 233 is adjusted to a fully-open configuration, which matches a minimum ventilation requirement of electrical loads cooled by cooling air 202. As a result, minimum intake air damper 233 can be adjustably positioned into a fully-open configuration, where primary intake air damper 235 is in a fully-closed configuration, to ensure that the minimum ventilation requirement is met. The minimum ventilation requirement can refer to a minimum flow rate of cooling air 202 to electrical loads in data center 200 which precludes heat overload of one or more heat-producing components of the electrical loads.

In some embodiments, the minimum intake air damper 233 is positioned on wall 231 at an elevation which is above the primary intake air damper 235. As a result, minimum intake air damper 233 can direct intake air flow 222 from upper portion 224 of plenum 220 into the mixing plenum 230, while primary intake air damper 235 can direct intake air flow 221 from lower portion 223 of plenum 220. In some embodiments, intake air flow 222 includes a mixed air flow 213 of ambient air flow 212 and preheat air flow 215 which has flowed through the upper portion 217 of mist eliminator 214, while intake air flow 221 is ambient air flow 212 which has flowed through the lower portion 216 of mist eliminator 214. As a result, intake air flow 222 may have an elevated temperature relative to intake air flow 221. Thus, the intake air flow 222 may preferentially pass through upper portion 224 of plenum 220 relative to the lower portion 223, based at least in part upon one or more of an air density gradient which causes the warmer air flow 222 to pass through plenum 220 at an elevation that is above the cooler air flow 221.

Furthermore, the positioning of minimum intake air damper 233 above damper 235 enables the minimum intake air damper 233 to preferentially receive warmer intake air 222 relative to the primary intake air damper 235, so that the mixed air flow 213, also referred to herein as a "tempered" air flow, can pass into mixed air plenum regardless of the configuration of the primary intake air damper 235. In addition, where intake air flow 221 is restricted based at least in part upon ice accumulation in lower portion 216 of mist eliminator, intake air flow 222 can pass into mixed air plenum 230 via a shortest path through plenum 220 to damper 233.

In some embodiments, dampers 264, 263 can be adjustably positioned together, based at least in part upon command signals generated at one or more portions of controller 291, to enable ambient air flow 212 to pass into mixed air plenum 230 via a portion of return air plenum 260 between dampers 264, 263. Such adjustable control, adjustable positioning, etc. may be based at least in part upon a determined pressure differential between plenum 210 and one or more of plenum 220, 230, etc. exceeding a certain threshold pressure difference. In response to the determination, the dampers 264, 263 may be adjustably positioned into fully-open configurations to enable the ambient air flow 212 to flow through damper 264 into the return air plenum 260, through plenum 260 to damper 263, and through damper 263 into the mixed air plenum, bypassing the mist eliminator 214, plenum 220, and dampers 233, 235. While such bypass directing may preclude moisture removal from the ambient air flow 212, the directing can mitigate the risk of structural failure of one or more of the air handling unit 290, mist eliminator 214, etc. due to the pressure differential exceeding a threshold amount, including a pressure difference which can cause implosion of the air handling unit 290, mist eliminator, etc.

In some embodiments, dampers 233, 235, 263 are adjustably positioned based at least in part upon one or more characteristics of cooling air 202 downstream of the air handling unit 290. The dampers may be modulated to maintain the temperature of the cooling air 202, for example, within one or more certain temperature ranges. The dampers may be modulated to maintain the cooling air 202 temperature above one or more certain thresholds. In one example, the minimum intake air damper 233 is adjustably positioned to a fully-open configuration to ensure that minimum ventilation requirements of electrical loads of the data center 200 are satisfied, and the primary intake air damper 235 and the return air damper 263 are adjustably positioned in counter-opposition to control the relative flow rates of air through the respective dampers. As a result, damper 235 may be in a fully-open configuration and damper 263 may be in a fully-closed configuration, and damper 263 may be adjustably positioned to progressively open as damper 235 is adjustably positioned to progressively close. The dampers 263 and 235 may be adjustably positioned in counter-opposite to respectively progressively open and close, respectively, based at least in part upon the cooling air temperature 202 being determined to be below a certain threshold temperature. Mixing exhaust air 234 with the intake air flow 232 can result in a cooling air flow 202 with a raised temperature relative to intake air flow 232, thereby progressively opening damper 263 and progressively closing damper 235 can progressively increase the flow rate of return air flow 234 while progressively decreasing the flow rate of intake air flow 232. The relative proportions of intake air 232 and return air 234 in mixed air flow 237 may therefore be adjustably positioned to control the temperature of cooling air 202. In some embodiments, damper 235 and damper 263 are adjustably positioned independently of each other.

In some embodiments, where the temperature of cooling air 202 is determined to be below a certain threshold, and damper 263 is in a fully-open configuration and damper 235 is in a fully-closed configuration, damper 233 can be adjustably positioned into one or more of a plurality of configurations ("modulated") to maintain control of the cooling air 202 temperature and to raise the cooling air temperature 202 above the certain threshold. In some embodiments, cooling of air 241 by cooling loop 244 can be controlled, including via controlling cooling flow rates via coolant lines 252, controlling cooling of coolant via heat exchanger 254, some combination thereof, or the like, based at least in part upon the cooling air 202 temperature.

In some embodiments, one or more of the dampers illustrated in FIG. 2 can be a flow control element. For example, in some embodiments, preheat flow control element 264 can direct air 215 into plenum 210, return flow control element 264 can direct air 234 into plenum 230, one or more of minimum intake flow control element 233 and primary intake flow control element 235 can direct air 221-222 into plenum 230, etc.

In some embodiments, one or more portions of data center 200, illustrated in FIG. 2, can be implemented, in part or in full, by data center 100 illustrated and described above with reference to FIG. 1.

Figure 3:
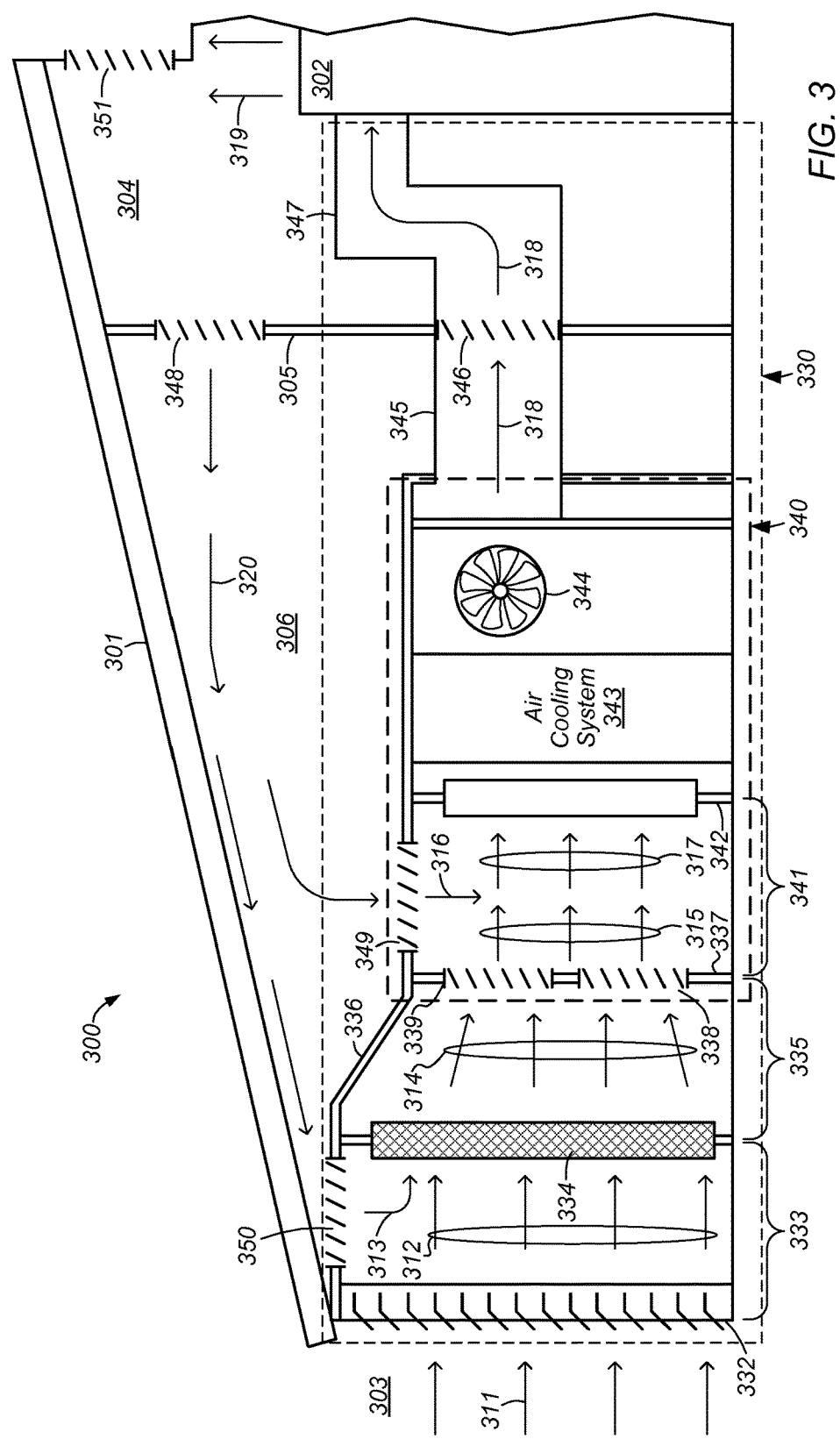
FIG. 3 is a cross-sectional schematic view of a portion of a data center that includes an air handling unit, exhaust air plenum, mist eliminator, and air preheat damper, according to some embodiments.

FIG. 3 is a cross-sectional schematic view of a portion of a data center that includes an air handling unit, exhaust air plenum, mist eliminator, and air preheat damper, according to some embodiments.

Data center 300 includes an angled roof structure 301 which covers various plenums in data center 300. In some embodiments, the angled roof structure 301 can direct air rising through various plenums towards one or more vents, as discussed further below.

Data center 300 includes computer room 302, which can include various electrical loads, which can themselves include one or more rack computer systems installed in the computer room 302. Data center 300 includes an air supply system 330 which supplies cooling air 318 to remote heat from the various electrical loads in the computer room 302. Data center 300 includes an exhaust plenum 304, located at least partially above computer room 302, wherein exhaust air 319 discharged from the electrical loads in computer room 302 exits the computer room, via one or more exhaust vents, and rises into plenum 304 based at least in part upon one or more gradients, including an air density gradient, pressure gradient, some combination thereof, or the like.

In some embodiments, angled roof structure 301 directs at least some of the exhaust air 319 towards exit air damper 351. Exhaust air 319 can be directed out of plenum 304 and into the ambient environment 303 via the exit damper 351 based at least in part upon one or more gradients across the damper 351 from plenum 304 towards ambient environment 303, including one or more of a pressure gradient, air density gradient, etc. In some embodiments, damper 351 includes one or more sets of air moving devices which can induce a pressure gradient towards damper 351 which draws exhaust air 319 towards damper 351 to be discharged into ambient environment 303.

Data center 300 includes a return air plenum 306, which is at least partially partitioned from exhaust air plenum 304 by a wall element 305. Wall element 305, which can include one or more various structural materials which at least partially partition plenums 306, 304, can, in, some embodiments, partition plenums 306, 304 so that a pressure gradient between the respective plenums 306, 304 is established across wall element 305. Wall element 305 includes dampers 348, 346, each of which can include a separate respective set of adjustably positionable dampers which can be adjustably positioned to adjustably control air flow rates through at least the respective damper.

In some embodiments, a return air flow 316 is directed from plenum 306 to mix with intake air in air handling unit 340 via return air damper 349. The return air flow 316 can be a portion of the exhaust air flow 320 received into the return air plenum 306 from exhaust air plenum 304 via exhaust return damper 348. In some embodiments, exhaust air 320 is directed into plenum 306 from plenum 304 through damper 348 based at least in part upon one or more of a pressure gradient, air density gradient, etc. across damper 348 from plenum 304 towards plenum 306. In some embodiments, damper 348 includes an air moving device which induces the exhaust air flow 320.

Data center 300 includes an air supply system 330 which supplies cooling air 318 to computer room 302. Air supply system 330 can receive air from the ambient environment 303 as an ambient air flow 311. Air supply system 330 can receive air from the return air plenum 306 via one or more of return air damper 349 and preheat air damper 350. Air supply system 330 includes a set of louvers 332 through which ambient air flow 311 passes from the ambient environment 303 into an ambient air plenum 333 within data center 300. Ambient air flow 312 in the ambient air plenum 333 can pass through mist eliminator 334 into intake air plenum 335 as intake air flow 314. The mist eliminator 334 at least partially removes moisture from ambient air flow 312 as the ambient air flow passes through the mist eliminator 334. In some embodiments, mist eliminator 334 comprises a mesh surface which separates moisture, which can include water vapor, from the air flow 312 based at least in part upon impingement of the air flow 312 on the mesh surface included in the mist eliminator 334.

Data center 300 includes a preheat air damper 350 which directs a portion of exhaust air flow 320 from return air plenum 306 to plenum 333 as preheat air flow 313 to mix with at least a portion of ambient air flow 312. In some embodiments, the preheat air damper 350 directs the preheat air flow 313 to mix with a limited portion of the ambient air flow 312. For example, air supply system 330 includes an roof element 336 which partitions plenums 333, 335, 341, air cooling system 343, etc. from plenum 306, and preheat air damper is installed in the roof element 336, so that the preheat air flow 313 is directed downwards into plenum 333 to mix with an upper portion of ambient air flow 312 which flows through an upper portion of ambient air plenum 333.

Data center 300 includes a wall element 337 which partitions intake air plenum 335 from air handling unit 340. As shown, wall element 337 partitions plenum 335 from a mixing plenum 341 of the air handling unit. Data center 300 includes a set of intake air dampers 338-339 which direct at least a portion of intake air flow 314 into air handling unit. Dampers 338-339 include a minimum intake air damper 339 and a primary intake air damper 338 which are adjustably positionable to adjustably control flow rates of intake air into air handling unit 340. The minimum intake air damper 339 and primary intake air damper 338, in some embodiments, are adjustably positioned independently of each other.

Air handling unit 340 includes a mixing air plenum 341, filter bank 342, air cooling system 343, and air moving device 344. intake air flow 315, received into mixing air plenum 341 via one or more of intake air dampers 338-339, can be mixed with return air flow 316 directed into mixing air plenum 341 from plenum 360 via return air damper 349. The mixed air flow 317 is directed through filter bank 342. Filter bank 342 includes one or more sets of air filters which remove various environmental elements, including particulate matter, sand, dust, etc., from the mixed air flow 317. At least a portion of air passing through filter bank 342 passes through air cooling system 343. Air cooling system 343, in some embodiments, cools the mixed air flow to provide cooling air flow 318. Air cooling system 343 can include one or more various cooling systems, including one or more mechanical cooling systems, evaporative cooling systems, some combination thereof, or the like. In some embodiments, air cooling system 343 is a free-cooling system. Air moving device 344 induces at least the cooling air flow 318 out of air handling unit 340 and into computer room 302 via conduits 345, 347. Conduit 345 directs cooling air flow 318 to supply air damper 346, which directs the cooling air flow 318 across the wall element 305. Conduit 347 directs the cooling air flow 318 from the supply air damper 346 to computer room 302. In some embodiments, moving air device 344 induces one or more of air flows 311-318 into and through one or more portions of the air supply system 330. The air moving device 344 may induce one or more of the air flows by establishing a pressure gradient through at least a portion of the air supply system.

In some embodiments, preheat air damper 350 is a two-position damper which can be adjustably positioned into either a fully-closed configuration, where preheat air flow 313 is completely restricted, and a fully-open configuration where the preheat air flow 313 is maximized. In some embodiments, preheat air damper 350 is adjustably positionable to be "modulated" between one or more of a plurality of configurations between fully-open and fully-closed. The preheat air damper 264 can be adjustably positioned based at least in part upon a temperature of the ambient air flow 311, 312, ambient environment 303, some combination thereof, or the like. For example, with reference to control system 104 of FIG. 1, preheat air damper 350 may be in a fully-closed configuration, such that preheat air flow 313 is restricted, where the ambient temperature of ambient environment 303 is above a certain temperature. Where the ambient environment 303 temperature is determined to be below a certain threshold temperature, which can be a certain margin above a freezing temperature of water (e.g., 39 degrees Fahrenheit), the preheat air damper 350 may be adjustably positioned into a fully-open configuration, so that a maximum preheat air flow 313 is directed into a portion of the ambient air plenum 333 to mix with a portion of ambient air flow 312.

In some embodiments, dampers 350, 349 can be adjustably positioned together to enable ambient air flow 312 to pass into mixed air plenum 341 via a portion of return air plenum 306 between dampers 350, 349. Such adjustable control, adjustable positioning, etc. may be based at least in part upon a determined pressure differential between plenum 333 and one or more of plenum 335, 341, etc. exceeding a certain threshold pressure difference. In response to the determination, the dampers 350, 349 may be adjustably positioned into fully-open configurations to enable the ambient air flow 312 to flow through damper 350 into the return air plenum 306, through plenum 306 to damper 349, and through damper 349 into the mixed air plenum 341, bypassing the mist eliminator 334, plenum 335, and dampers 338-339. While such bypass directing may preclude moisture removal from the ambient air flow 312, the directing can mitigate the risk of structural failure of one or more of the air handling unit 340, mist eliminator 334, etc. due to the pressure differential exceeding a threshold amount, including a pressure difference which can cause implosion of the air handling unit 340, mist eliminator 334, etc.

In some embodiments, intake air plenum 336 directs intake air 314 into the air handling unit 340. Intake air plenum 336 can be configured to change one or more characteristics of the intake air flow 314. Such configuration can include the intake air plenum 335 being shaped, based at least in part upon the roof element 336, to direct air towards particular dampers 339, 338, increase the intake air 314 flow velocity, reduce the intake air flow static pressure, some combination thereof, or the like. For example, the illustrated intake air plenum 335 is configured, based at least in part upon the portion of roof element 336 which slopes downwards towards the air handling unit 340, so that the flow velocity of intake air flow 314 towards air handling unit 340 increases as the cross-sectional flow area of the intake air plenum 335 decreases from the mist eliminator 3343 towards the air handling unit 340.

In some embodiments, dampers 338, 339, 349 are adjustably positioned based at least in part upon one or more characteristics of cooling air 318 downstream of the air handling unit 290. Such adjustable control, adjustable positioning, etc. can be implemented by one or more controllers, including one or more of the controllers illustrated and discussed above with reference to FIG. 1-2. The dampers may be modulated to maintain the temperature of the cooling air 318, for example, within one or more certain temperature ranges. The dampers may be modulated to maintain the cooling air 318 temperature above one or more certain thresholds. In one example, the minimum intake air damper 339 is adjustably positioned to a fully-open configuration to ensure that minimum ventilation requirements of electrical loads in the computer room 302 are satisfied, and the primary intake air damper 338 and the return air damper 349 are adjustably positioned in counter-opposition to control the relative flow rates of air through the respective dampers. As a result, damper 338 may be in a fully-open configuration and damper 349 may be in a fully-closed configuration, and damper 349 may be adjustably positioned to progressively open concurrently with damper 338 being adjustably positioned to progressively close. The dampers 349 and 338 may be adjustably positioned in counter-opposition to progressively open and close, respectively, based at least in part upon the cooling air temperature 318 being determined to be below a certain threshold temperature. Mixing a portion of exhaust air flow 320 with the intake air flow 315 can result in a cooling air flow 318 with a raised temperature. Therefore, progressively opening damper 349 and progressively closing damper 338 can progressively increase the flow rate of return air flow 316 while progressively decreasing the flow rate of intake air flow 315. The relative proportions of intake air 315 and return air 316 in mixed air flow 317 may therefore be adjustably positioned to control the temperature of cooling air 318. In some embodiments, damper 338 and damper 349 are adjustably positioned independently of each other.

In some embodiments, where the temperature of cooling air 318 is determined to be below a certain threshold, and damper 349 is in a fully-open configuration and damper 338 is in a fully-closed configuration, damper 339 can be adjustably positioned into one or more of a plurality of configurations ("modulated") to maintain control of the cooling air 318 temperature and to raise the cooling air temperature 318 above the certain threshold. In some embodiments, cooling of at least a portion of mixed air flow 317 by one or more cooling systems included in air cooling system 343 can be controlled, based at least in part upon the cooling air flow 318 temperature.

In some embodiments, one or more portions of data center 300, illustrated in FIG. 3, can be implemented, in part or in full, in one or more of data center 100 illustrated and described above with reference to FIG. 1, data center 200 illustrated and describe above with reference to FIG. 2, etc.

Figure 4:
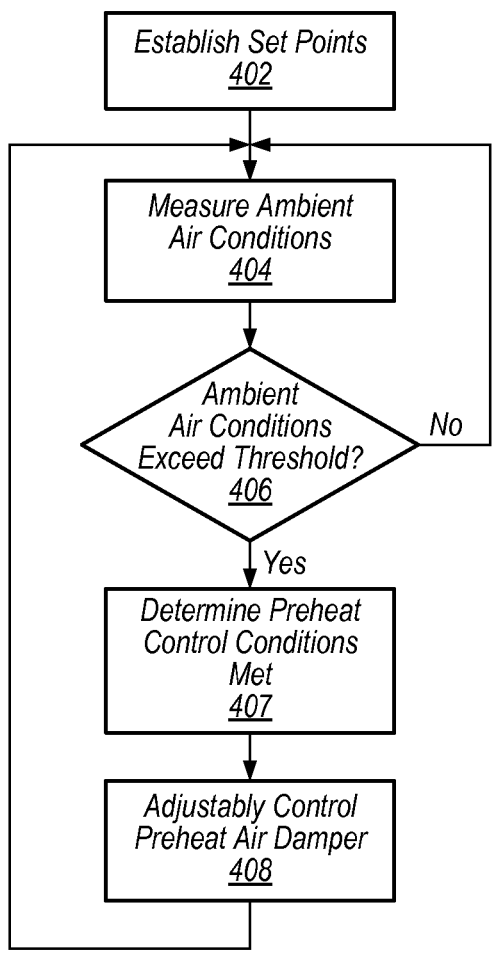
FIG. 4 illustrates adjustably positioning a preheat air damper system, according to some embodiments.

FIG. 4 illustrates adjustably positioning a preheat air damper system, according to some embodiments. Such adjustably positioning can be implemented by one or more controllers, including one or more of controller 106, BAS 102, and control system 104 illustrated above with reference to FIG. 1, one or more portions of controller 291 in FIG. 2, etc. In some embodiments, such portions are implemented by one or more computer systems, illustrated and described below with reference to FIG. 7.

In some embodiments, operations of one or more portions of an air supply system are adjustably positioned based at least in part upon one or more conditions. Such conditions can include determinations that one or more control conditions are currently being met.

For example, control system 104 in FIG. 1 may be programmed to adjustably position preheat air damper 134 to be adjusted from a fully-closed configuration to a fully-open configuration based at least in part upon one or more control conditions, including one or more threshold values of temperature, relative humidity, etc., being determined to be met. Such control conditions can include one or more particular characteristics of ambient air exceeding one or more particular thresholds, including a low temperature threshold value.

In another example, controller 106 in FIG. 1 may be programmed to adjustably position intake air dampers 126, which can include a minimum intake air damper and primary intake air damper, and return air damper 133 to adjustably control relative flow rates of intake air and return air into the air handling unit 122 based at least in part upon one or more separate control conditions being met. An example of such separate control conditions includes a temperature of cooling air 127 being supplied from air handling unit 122 into computer room 110 having a temperature which exceeds a low temperature threshold value.

At 402, set points are established for one or more control conditions. The control conditions can be associated with adjustable control, adjustable positioning, etc. of separate sets of dampers in the data center 100. For example, a first control condition may be associated with intake air dampers 126 and return air damper 133, so that dampers 126, 133 are adjustably positionable to adjustably position one or more of a return air flow, intake air flow, etc. into mixing air plenum 143 based at least in part upon a determination that the first control condition is met. In another example, a second control condition may be associated with preheat air damper 134, so that preheat air damper 134 is adjustably positionable to adjustably control a flow rate of preheat air into the ambient air plenum 141 based at least in part upon a determination that the second control condition is met.

In some embodiments, one or more control conditions are associated with preheat air damper 134 and return air damper 133, so that both dampers are adjustably positionable based at least in part upon a determination that the control conditions are met.

In some embodiments, one or more of the set points include one or more of temperature measurements, relative humidity measurements, pressure measurements, temperature differences, pressure differences, etc. Measurements such as dry bulb temperature, wet bulb temperature, humidity, and pressure may be taken for ambient air, intake air, return air, cooling air, exhaust air, or at any other location in data center 100.

At 404, one or more characteristics of ambient air are compared to one or more set points associated with one or more control conditions. In one example, the characteristics of ambient air include a measurement of ambient air temperature generated by a temperature sensor. In some embodiments, the measured ambient air temperature is compared with a set point which is a predetermined ambient temperature minimum set point. If the ambient temperature is determined to be less than the minimum set point, as shown at 406 and 407, a particular set of control conditions associated with such a determination is determined to be met. In some embodiments, the particular set of control conditions includes a determination that there is an unacceptable risk of ice accumulation in one or more portions of the air supply system, including one or more portions of a mist eliminator upstream of the mixing air plenum where return air can be mixed with intake air. Such a set of control conditions, as shown in FIG. 4, can be referred to as a set of preheat control conditions. In some embodiments, the set of control conditions are referred to as a second set of control conditions.

As shown at 408, based at least in part upon the particular set of control conditions being determined to be met, the preheat air damper is adjustably positioned to direct a preheat air flow into an ambient air plenum to mix with at least a portion of the ambient air flow upstream of at least intake air dampers and return air dampers in the air supply system. In some embodiments, the preheat air damper is adjustably positioned to direct the preheat air flow into the ambient air plenum to mix with at least a portion of the ambient air flow upstream of a mist eliminator device which removes moisture from the ambient air received into the data center to provide intake air. Adjustably positioning the preheat air damper can include generating a command signal to an actuator to adjust one or sets of dampers to one or more particular positions associated with a configuration. In some embodiments, one or more of the dampers illustrated in at least FIG. 1-3 include one or more actuators mechanically coupled to at least a portion of the dampers, and the actuators can adjust the dampers based at least in part upon receiving a command signal from one or more controllers, including one or more of controller 106, control system 104, BAS 102, etc.

Figure 5:
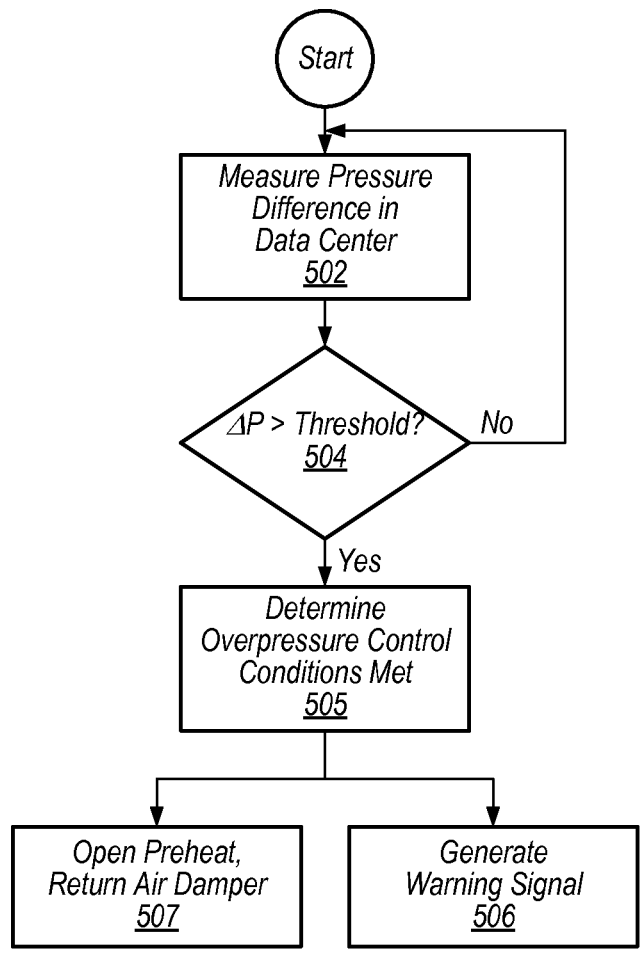
FIG. 5 illustrates adjustably positioning a preheat air damper system and a return air damper system, according to some embodiments.

FIG. 5 illustrates adjustably positioning a preheat air damper system and a return air damper system, according to some embodiments. Such adjustably positioning can be implemented by one or more controllers, including one or more of controller 106, BAS 102, and control system 104 illustrated above with reference to FIG. 1, one or more portions of controller 291 in FIG. 2, etc. In some embodiments, such portions are implemented by one or more computer systems, illustrated and described below with reference to FIG. 7.

At 502, a pressure difference across one or more portions of an air supply system can be determined based at least in part upon receiving pressure measurements from pressure sensors in various portions of the air supply system and determining a difference between the pressure measurements. For example, a determined pressure difference can include a pressure difference between a measurement of the pressure in an ambient air plenum upstream of the mist eliminator 124 in FIG. 1 and a measurement of the pressure in the intake air plenum downstream of the mist eliminator 124.

At 504, a determination is made regarding whether a pressure difference across one or more portions of the air supply system exceeds a predetermined set point. The set point can include one or more maximum pressure difference threshold values associated with various components in the air supply system, including an implosion pressure threshold associated with the air handling unit As shown at 505, determination that a pressure difference across one or more portions of the air supply system exceeds a predetermined set point can include a determination that one or more sets of control conditions are met. Such sets of control conditions may include a determination that there exists an unacceptable risk of damage to one or more portions of the air supply system, including the mist eliminator, air handling unit, etc. based at least in part upon an excessive pressure difference in the air supply system. Such a determination can include a determination that one or more portions of the air supply unit are obstructed. For example, where a pressure difference is determined based at least in part upon pressure measurements upstream and downstream of a mist eliminator, a determination that the pressure difference exceeds a predetermined threshold value can include a determination that the mist eliminator is at least partially obstructed. The set of control conditions can be referred to as a set of overpressure control conditions.

As shown at 506, in some embodiments, a warning message is generated in response to a determination of a set of overpressure control conditions, where the warning message can be transmitted to one or more computer systems supporting one or more data center operators to notify the operators of the obstruction, identify the location of the obstruction, instruct the operators to take corrective action to clear the obstruction, some combination thereof, or the like.

As shown at 507, in response to a determination that one or more sets of overpressure control conditions are met, based at least in part upon a determination that a pressure difference in at least a portion of the data center exceeds a threshold pressure difference threshold value, the preheat air damper and return air damper are adjustably positioned to direct ambient air into a portion of the air handling unit via a portion of the exhaust air plenum. Such a portion of the exhaust air plenum, which can include a return air plenum as described with reference to at least FIG. 3, can include an air passage between the preheat air damper and the return air damper, and adjustably positioning the preheat air damper and the return air damper can establish an air passage between an ambient air plenum in which ambient air is received into the data center and a portion of the air handling unit. The portion of the air handling unit into which the ambient air is directed via the return air damper can include a mixing air plenum at an upstream portion of the air handling unit, including one or more of the mixing air plenums illustrated and described with reference to one or more of FIG. 1-3. Adjustably positioning the preheat air damper and return air damper can include generating, at one or more controllers, computer systems implementing at least a portion of the one or more controllers, etc., one or more separate command signals which can be transmitted to separate actuators that are each mechanically coupled to a separate one of the preheat air damper and the return air damper, where each command signal can command the respective receiving actuator to adjust the respective mechanically coupled damper to a configuration associated with directing air through the damper.

Figure 6:
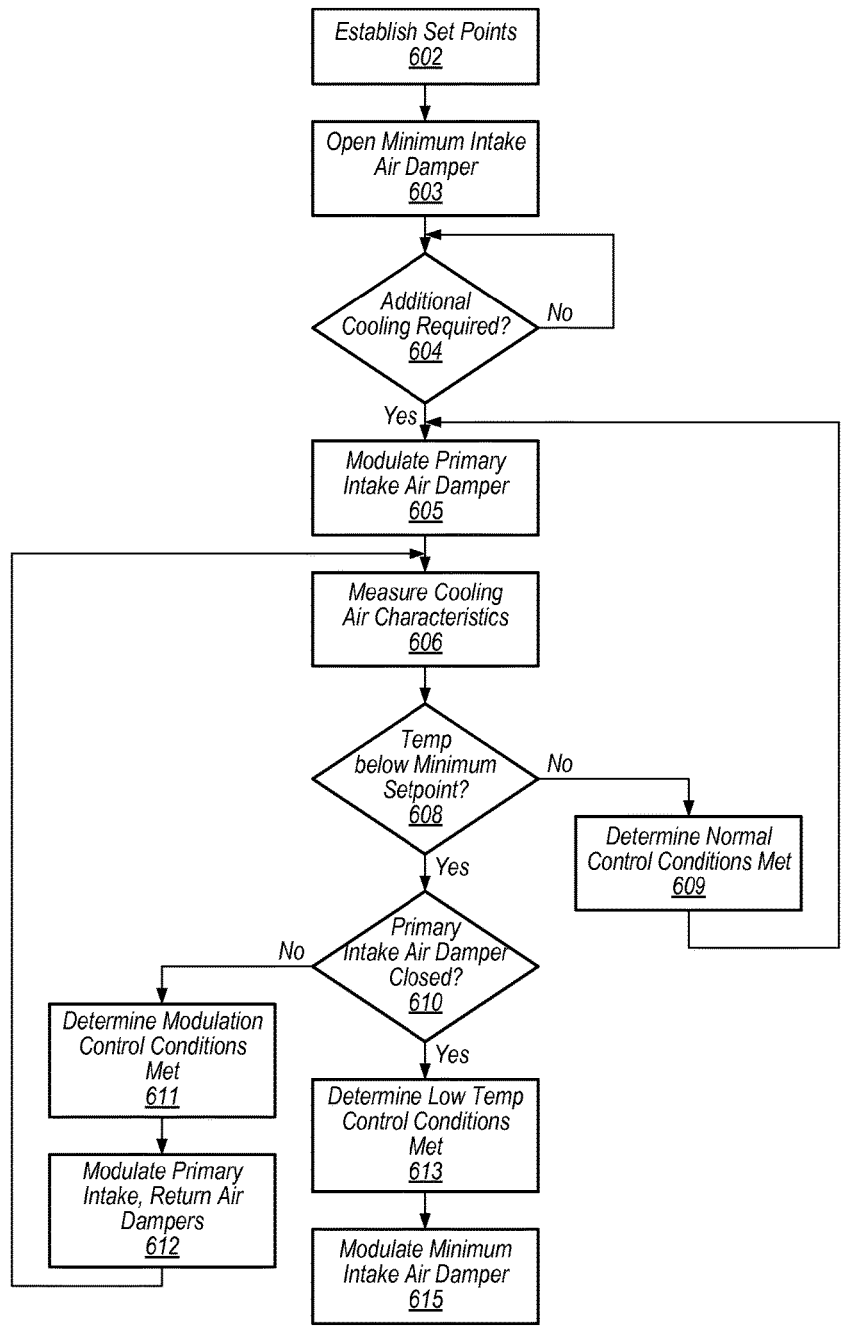
FIG. 6 illustrates adjustably positioning intake air dampers and a return air damper, according to some embodiments.

FIG. 6 illustrates adjustably positioning intake air dampers and a return air damper, according to some embodiments. Such adjustably positioning can be implemented by one or more controllers, including one or more of controller 106, BAS 102, and control system 104 illustrated above with reference to FIG. 1, one or more portions of controller 291 in FIG. 2, etc. In some embodiments, such portions are implemented by one or more computer systems, illustrated and described below with reference to FIG. 7.

In some embodiments, operation of one or more portions of an air supply system is adjustably positioned based at least in part upon one or more conditions. Such conditions can include determinations that one or more control conditions are currently being met.

For example, controller 291 in FIG. 2 may be programmed to adjustably position one or more of minimum intake air damper 233, primary intake air damper 235, and return air damper 263 to one or more various configurations, including a fully-closed configuration, a fully-open configuration, and various configurations in-between, based at least in part upon one or more control conditions, including one or more threshold values of temperature, relative humidity, etc., being determined to be met. Such control conditions can include one or more particular characteristics of cooling air, mixed air, etc. exceeding one or more particular thresholds, including a low temperature threshold value.

In another example, one or more portions of controller 291 in FIG. 2 may be programmed to adjustably position minimum intake air damper 233, primary intake air damper 235, and return air damper 263, to adjustably control relative flow rates of intake air and return air into the air handling unit 290 based at least in part upon one or more separate control conditions being met. An example of such separate control conditions includes a temperature of cooling air 202 being supplied from air handling unit 290 having a temperature which exceeds a low temperature threshold value.

At 602, set points are established for one or more control conditions. The control conditions can be associated with adjustable control, adjustable positioning, etc. of separate sets of dampers in the data center 100. For example, a first set of control conditions may be associated with intake air dampers 233, 235 and return air damper 263, so that dampers 233, 235, 263 are adjustably positionable to adjustably control one or more of a return air flow, intake air flow, etc. into mixing air plenum 230 based at least in part upon a determination that the first set of control conditions are met.

In some embodiments, one or more of the set points include one or more of temperature measurements, relative humidity measurements, pressure measurements, temperature differences, pressure differences, etc. Measurements such as dry bulb temperature, wet bulb temperature, humidity, and pressure may be taken for ambient air, intake air, return air, cooling air, exhaust air, or at any other location in a data center.

At 603, the minimum intake air damper is adjustably positioned to a fully-open configuration to direct a minimum intake air flow which corresponds to a minimum ventilation requirement of electrical loads provided cooling air via the air handling unit in which the minimum intake air damper is included. Such adjustable control, adjustable positioning, etc. can include generating a command signal, at a controller, which is transmitted to an actuator mechanically coupled to the damper to command the actuator to adjust the damper to the fully-open configuration. In some embodiments, the minimum intake air damper is adjustably positioned independently of the primary intake air damper and the return air damper.

At 604, a determination is made regarding whether additional cooling of electrical loads in the data center is required. Such a determination may be based at least in part upon a temperature associated with various heat producing components of the electrical loads. If, as shown at 605, additional cooling is required, the primary intake air damper is adjustably positioned from a fully closed configuration to one or more various configurations to direct additional intake air into the air handling unit.

At 606, one or more characteristics of cooling air provided by the air handling unit are measured. The characteristics can be compared to one or more set points associated with one or more sets of control conditions. In one example, the characteristics of cooling air include a measurement of cooling air temperature generated by a temperature sensor. In some embodiments, the measured cooling air temperature is compared with one or more set points which comprise a predetermined ambient temperature minimum set point. If the cooling temperature is not less than a minimum set point, as shown at 608 and 609, a set of normal control conditions is determined. In some embodiments, the set of normal control conditions is referred to as a first set of control conditions. Upon a set of normal control conditions being met, the primary intake air damper may be adjustably positioned independently of the minimum intake air damper and return air damper to control cooling air supply to the electrical loads. The adjustable control, adjustable positioning, etc. of the primary intake air damper may include continuously adjusting the primary intake air damper, referred to as "modulating" the damper, between various configurations to continuously manage the intake air flow through the primary intake air damper based at least in part upon cooling requirements of the electrical loads.

If, as shown at 610, the cooling air temperature is less than a minimum set point, a determination is made regarding whether the primary intake air damper is in a closed configuration. If not, as shown at 611, a set of modulation control conditions is determined to be met, and the primary intake air damper is modulated in counter-opposition with the return air damper, as shown at 612. In some embodiments, the set of modulation control conditions is referred to as a first set of control conditions. Modulating the primary intake air damper and return air damper in counter-opposition can include adjustably controlling the relative flow rates of intake air and return air into the air handling unit. Such adjustable control can include controlling the cooling air temperature, as the return air, being comprised of exhaust air discharged from one or more electrical loads in the data center, may be warmer than the intake air. As a result, mixing cooling intake air and warmer return air at various relative flow rates to provide a mixed air flow enables adjustable control of the temperature of the mixed air flow. Modulating the return air damper and primary intake air damper can include adjustably positioning the return air damper to increase return air flow, while concurrently adjustably positioning the primary intake air damper to decrease intake air flow, so that the temperature of the mixed air flow is increased.

If, as shown at 613, the primary intake air damper is determined to be in a fully-closed configuration, a set of low temperature control conditions is determined to be met. Where the primary intake air damper is determined to be in a closed configuration, the return air damper may be determined to be in an at least partially-open configuration, as return air damper and primary intake air damper can be modulated in counter-opposition. As a result, such a set of control conditions includes a condition where control of the mixed air temperature is at least partially lost, based at least in part upon the primary intake air damper being closed despite the cooling air temperature being below a threshold value, so that the mixed air temperature cannot be reduced based on reducing intake air flow through adjustably positioning the primary intake air damper.

As shown at 615, based at least in part upon the set of low temperature control conditions being determined to be met, the minimum intake air damper is modulated to adjustably control intake air flow into the air handling unit. Because, as noted above, the return air damper can be in an at least partially-open configuration concurrently with the primary intake air damper being in a fully-closed configuration, such that return air is directed into the air handling unit, the minimum intake air requirements of the electrical loads in the data center can be satisfied by a cooling air provided based at least in part upon a mixed air flow which includes intake air and return air, although the minimum intake air flow is being modulated to reduce the intake air flow below a flow rate required to satisfy the minimum ventilation requirement.

Figure 7:
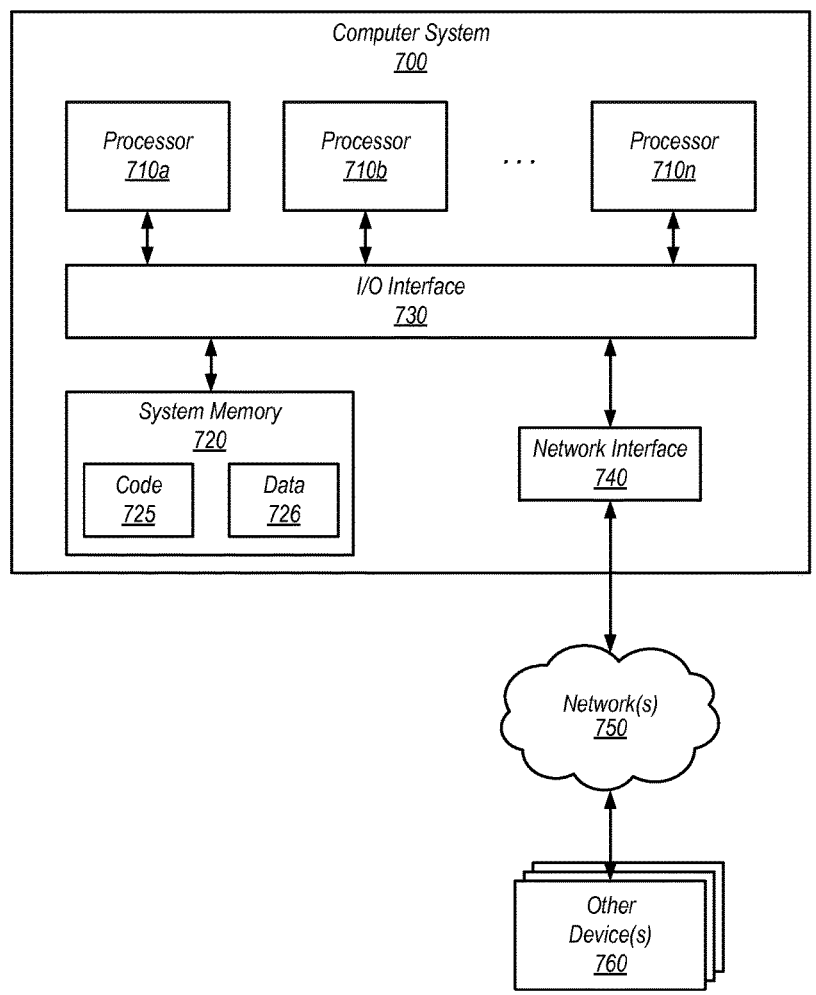
FIG. 7 is a block diagram illustrating an example computer system that may be used in some embodiments.

FIG. 7 is a block diagram illustrating an example computer system that may be used in some embodiments.

In some embodiments, a system that implements a portion or all of one or more of the technologies, including but not limited to one or more portions of the controllers, control systems, one or more components included in the one or more portions, and various airflow, temperature, and power management methods, systems, devices, and apparatuses as described herein, may include a general-purpose computer system that includes or is configured to access one or more computer-accessible media, such as computer system 700 illustrated in FIG. 7. In the illustrated embodiment, computer system 700 includes one or more processors 710 coupled to a system memory 720 via an input/output (I/O) interface 730. In some embodiments, computer system 700 further includes a network interface 740 coupled to I/O interface 730. In some embodiments, computer system 700 is independent of a network interface and can include a physical communication interface that can couple with a communication pathway, including a communication cable, power transmission line, etc. to couple with various external components, systems, etc.

In various embodiments, computer system 700 may be a uniprocessor system including one processor 710, or a multiprocessor system including several processors 710 (e.g., two, four, eight, or another suitable number). Processors 710 may be any suitable processors capable of executing instructions. For example, in various embodiments, processors 710 may be general-purpose or embedded processors implementing any of a variety of instruction set architectures (ISAs), such as the x86, PowerPC, SPARC, or MIPS ISAs, or any other suitable ISA. In multiprocessor systems, each of processors 710 may commonly, but not necessarily, implement the same ISA.

System memory 720 may be configured to store instructions and data accessible by processor(s) 710. In various embodiments, system memory 720 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as one or more portions of the airflow characteristic monitoring, damper adjustable control, and various airflow, temperature, and power management methods, systems, devices, and apparatuses as described herein, are shown stored within system memory 720 as code 725 and data 726.

In one embodiment, I/O interface 730 may be configured to coordinate I/O traffic between processor 710, system memory 720, and any peripheral devices in the device, including network interface 740 or other peripheral interfaces. In some embodiments, I/O interface 730 may perform any necessary protocol, timing or other data transformations to convert data signals from one component (e.g., system memory 720) into a format suitable for use by another component (e.g., processor 710). In some embodiments, I/O interface 730 may include support for devices attached through various types of peripheral buses, such as a variant of the Peripheral Component Interconnect (PCI) bus standard or the Universal Serial Bus (USB) standard, for example. In some embodiments, the function of I/O interface 730 may be split into two or more separate components, such as a north bridge and a south bridge, for example. Also, in some embodiments some or all of the functionality of I/O interface 730, such as an interface to system memory 720, may be incorporated directly into processor 710.

Network interface 740 may be configured to allow data to be exchanged between computer system 700 and other devices 760 attached to a network or networks 750, such as other computer systems or devices as illustrated in FIGS. 1 through 6, for example. In various embodiments, network interface 740 may support communication via any suitable wired or wireless general data networks, such as types of Ethernet network, for example. Additionally, network interface 740 may support communication via telecommunications/telephony networks such as analog voice networks or digital fiber communications networks, via storage area networks such as Fibre Channel SANs, or via any other suitable type of network and/or protocol.

In some embodiments, system memory 720 may be one embodiment of a computer-accessible medium configured to store program instructions and data for implementing embodiments of air characteristic monitoring and damper adjustable control methods as described above relative to FIGS. 1-6. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 700 via I/O interface 730. A non-transitory computer-accessible storage medium, also referred to as a non-transitory computer-readable storage medium, may also include any volatile or non-volatile media such as RAM (e.g. SDRAM, DDR SDRAM, RDRAM, SRAM, etc.), ROM, etc., that may be included in some embodiments of computer system 700 as system memory 720 or another type of memory. Further, a computer-accessible medium may include transmission media or signals such as electrical, electromagnetic, or digital signals, conveyed via a communication medium such as a network and/or a wireless link, such as may be implemented via network interface 740.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system for cooling computer systems in a room of a data center, comprising:
    an exhaust air plenum configured to receive exhaust air from computer systems in the room of the data center;
    an air handling unit configured to supply cooling air to the computer systems in the room of the data center, the air handling unit comprising:
        an air cooling unit configured to remove heat from the cooling air;
        at least one air filter upstream from the air cooling unit;
        at least one intake air damper configured to control a supply of intake air to the air cooling unit; and
        at least one return air damper configured to control a supply of exhaust air from the exhaust air plenum to mix with the intake air at a first location upstream of the air cooling unit;
    an intake air plenum configured to direct ambient air into the air handling unit as intake air;
    at least one mist eliminator device upstream from the intake air plenum and upstream of the first location, wherein the at least one mist eliminator device is configured to remove moisture from ambient air directed into the intake air plenum;
    at least one preheat air damper configured to direct exhaust air from the exhaust air plenum to mix with the ambient air at a second location upstream of the mist eliminator device and upstream of the first location; and
    at least one controller coupled to the preheat air damper, the controller configured to adjustably position the preheat air damper, based at least in part upon the ambient air temperature, to at least partially mitigate ice accumulation in the mist eliminator device.

2. The system of claim 1, wherein:
    the at least one intake air damper comprises:
        a minimum intake air damper configured to supply, to the air handling unit, a minimum flow rate of intake air that corresponds to a minimum cooling requirement of the room of the data center; and
        a primary intake air damper configured to supply, to the air handling unit, a primary flow rate of intake air; and
    the at least one controller comprises an air handling unit controller coupled to at least the primary intake air damper and the return air damper, wherein the air handling unit controller is configured to adjustably position both the primary intake air damper and the return air damper in counter-opposition based at least in part upon at least a temperature of the cooling air downstream of the air handling unit.

3. The system of claim 2, wherein:
    the minimum intake air damper and the primary intake air damper are coupled to an upper portion of the air handling unit; and
    the primary intake air damper is coupled to the upper portion at a position that is beneath the minimum intake air damper.

4. The system of claim 1, wherein:
    the least one controller is further configured to adjustably position the preheat air damper and the return air damper, based at least in part upon a determined pressure difference across the mist eliminator device, to route ambient air into the air handling unit as intake air via at least a portion of the exhaust air plenum.

5. A method, comprising:
    providing an air handling unit, wherein the air handling unit is configured to supply cooling air to a computer room of a data center, and wherein the air handling unit includes an air cooling system that cools air to produce the cooling air supplied to the computer room of the data center; and
    directing intake air to the air handling unit to provide the cooling air, wherein directing intake air to the air handling unit comprises:
        directing ambient air from an ambient environment to the air handling unit, via a mist eliminator upstream of the air handling unit, to provide the intake air;
        adjustably positioning a return flow control element to direct exhaust air received from the computer room, via an exhaust air plenum, to mix with the intake air upstream of the air cooling system, at a first location downstream of the mist eliminator and upstream of the air cooling system, in response to a determination that a first set of control conditions is met; and adjustably positioning a preheat flow control element to direct exhaust air received from the computer room, via the exhaust air plenum, to mix with the ambient air, at a second location upstream of the mist eliminator and upstream of the first location, in response to a determination that a second set of control conditions is met.

6. The method of claim 5, wherein:
directing ambient air from the ambient environment to the air handling unit comprises directing the intake air through a set of intake flow control elements, which are downstream of the mist eliminator, into a mixing plenum that is upstream of the air handling unit.

7. The method of claim 6, wherein:
the first set of control conditions comprises a determination that a cooling air temperature associated with the cooling air is less than a predetermined threshold cooling air temperature; and
the second set of control conditions comprises a determination that an ambient temperature associated with the ambient air is less than a predetermined threshold ambient air temperature.

8. The method of claim 7, wherein:
the predetermined threshold ambient air temperature is associated with ice formation in at least a portion of the mist eliminator.

9. The method of claim 6, wherein:
the set of intake flow control elements comprises a minimum intake flow control element and a primary intake flow control element.

10. The method of claim 9, wherein:
directing the ambient air through the set of intake flow control elements into the mixing plenum comprises:
adjustably positioning the minimum intake flow control element into a fully-open position to direct a minimum flow rate of cooling air to the computer room, wherein the minimum flow rate of cooling air corresponds with minimum ventilation requirements of computer systems mounted in the computer room; and
adjustably positioning both the primary intake flow control element and the return flow control element in counter-opposition to maintain one or more characteristics of the cooling air supplied to the computer room.

11. The method of claim 10, wherein:
the preheat flow control element is configured to direct exhaust air into an upper ambient air flow directed through the mist eliminator, independently of a lower ambient air flow, to mitigate ice buildup on an upper portion of the mist eliminator.

12. The method of claim 10, wherein:
the minimum intake flow control element is located above the primary intake flow control element, such that an upper intake air flow directed through the minimum intake flow control element has a greater temperature than a lower intake air flow directed through the primary intake flow control element, based at least in part upon relative air densities associated with the upper intake air flow and the lower intake air flow.

13. The method of claim 9, wherein directing the ambient air through the set of intake flow control elements into the mixing plenum further comprises:

adjustably positioning the minimum intake flow control element to adjust a flow rate of intake air into the air handling unit, based at least in part upon a determination that a cooling air temperature associated with the cooling air is less than a predetermined threshold cooling air temperature, wherein the return flow control element is in a fully-open position, and the primary intake flow control element is in a fully-closed position.

14. The method of claim 6, wherein directing intake air to the air handling unit comprises:
adjustably positioning the preheat flow control element and the return flow control element to direct ambient air to the mixing plenum via the exhaust air plenum, at least partially bypassing an intake air plenum, based at least in part upon a determination that a pressure difference between the ambient environment and the intake air plenum exceeds a predetermined threshold pressure difference value.

15. A method, comprising:
directing ambient air from an ambient environment through an air handling unit to provide cooling air into a room, wherein the directing comprises:
adjustably preheating ambient air directed to the air handling unit, based at least in part upon at least one measured characteristic of ambient air in the ambient environment, wherein the adjustably preheating includes mixing, at a first location, the ambient air with a first portion of exhaust air from the room to produce preheated air, and wherein the first portion of the exhaust air is directed from the room to the first location by an exhaust air plenum; and
adjustably mixing, at a second location downstream from the first location and upstream of an air cooling system, the preheated air with a second portion of the exhaust air from the room to produce mixed air, wherein the second portion of the exhaust air is directed from the room to the second location by the exhaust air plenum, and wherein the air cooling system is to cool air to produce the cooling air provided to the room.

16. The method of claim 15, wherein adjustably preheating ambient air directed to the air handling unit based at least in part upon at least one measured characteristic of ambient air in the ambient environment comprises:
adjustably preheating ambient air directed to the air handling unit based at least in part upon a determination that an ambient temperature associated with the ambient air is less than a predetermined threshold temperature.

17. The method of claim 15, wherein:
adjustably preheating ambient air directed to the air handling unit comprises adjustably positioning a preheat flow control element to adjustably control a preheat air flow of the first portion of the exhaust air from the exhaust air plenum to an ambient air plenum to mix with the ambient air at the first location; and
adjustably mixing the preheated air with the second portion of the exhaust air comprises adjustably positioning a return flow control element to adjustably control a return air flow of the second portion of the exhaust air from the exhaust air plenum to a mixing air plenum to mix with the ambient preheated air at the second location.

18. The method of claim 17, wherein directing ambient air from the ambient environment through the air handling unit to provide cooling air into the room comprises:

adjustably positioning the preheat flow control element and the return flow control element to direct the ambient air from the ambient environment to the air handling unit via at least a portion of the exhaust air plenum, based at least in part upon a determination that a pressure difference between the ambient environment and an intake air plenum exceeds a predetermined threshold pressure difference value.

19. The method of claim 17, wherein:

adjustably preheating ambient air directed to the air handling unit comprises adjustably positioning the preheat flow control element to adjustably control the preheat air flow of the first portion of the exhaust air from the exhaust air plenum to mix with the ambient air upstream of at least one intake flow control element to the air handling unit; and adjustably mixing the preheated air with the second portion of the exhaust air comprises adjustably positioning the return flow control element and the at least one intake flow control element in counter-opposition to adjustably control relative flow rates of the preheat air flow and the return air flow into the mixing air plenum.

20. The method of claim 15, wherein adjustably preheating the ambient air directed to the air handling unit comprises: adjustably preheating air upstream of a mist eliminator, where the mist eliminator is upstream of at least one filter assembly of the air handling unit, to at least partially mitigate ice formation in the mist eliminator.

* * * * *